June 3, 1958 R. EMEIS 2,837,704

JUNCTION TRANSISTORS

Filed April 5. 1955

United States Patent Office 2,837,704

Patented June 3, 1958

2,837,704

JUNCTION TRANSISTORS

Reimer Emeis, Pretzfeld, Germany, assignor to Siemens-Schuckertwerke Aktiengesellschaft, Berlin-Siemensstadt, Germany, a corporation of Germany Application April 5, 1955, Serial No. 499,395

Claims priority, application Germany April 6, 1954

16 Claims. (Cl. 317—235)

Figures 1, 2, 3, 4:
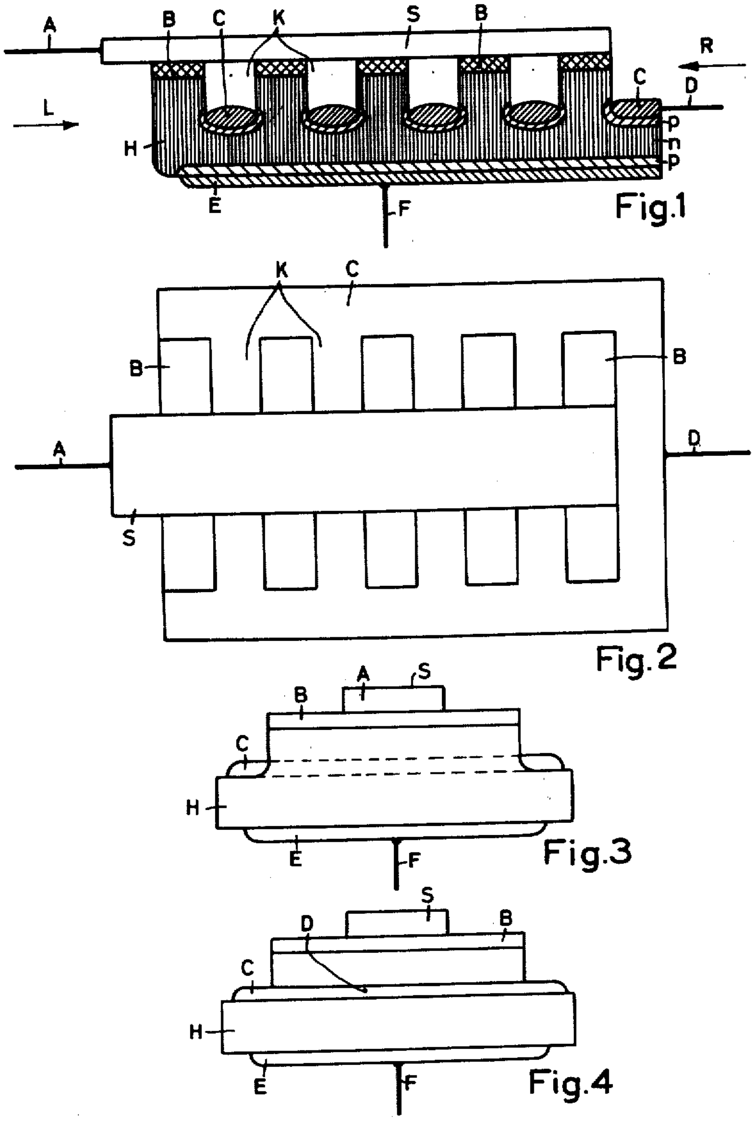

My invention relates to transistors of the junction or large-area type and, more particularly, to triode junction transistors.

Such transistors have a solid crystalline, preferably monocrystalline, body of semiconducting substance which comprises a base region of a given type of conductivity, namely either p-conductivity or n-conductivity, and two regions of the opposite type of conductivity. The latter regions are joined with leads or terminals to operate as emitter and collector respectively, and the base region is joined with a base contact. The required difference in the type of conductivity is secured by minute quantities of doping agents representing impurities in the semiconductor substance. For instance, doping germanium with donor impurities represented by such pentavalent substances as antimony, arsenic or bismuth produces excess-electrons and, consequently, can cause n-conductivity; while the presence of acceptor impurities represented by trivalent doping substances such as gallium, aluminum or indium produces defect-electrons and, consequently, can cause p-conductivity. Moreover the fundamental semiconductor substance must be extremely pure, and the amounts of doping agents are extremely slight, usually in the order of magnitude between $10^{-5}$ and $10^{-7}$ percent. Such concentrations of impurities are below those accurately measurable by chemical analysis and, for any given composition, are usually determined by their effect upon the specific resistivity of the fundamental semiconductor substance.

Relating to such junction transistors of the large-area type, it is an object of my invention to considerably increase the amplification factor and to also reduce the effective resistance of the base region.

Another object is to shorten as much as possible the distances to be traversed by the different currents within the semiconductor body.

Another object is to improve, for any given overall size of a junction transistor, the electric utilization or efficacy beyond that heretofore attained.

According to my invention, the base region of the transistor is contacted by a fused and alloyed layer of doping material having a doping effect upon the semiconducting material of the base region in the same sense as the impurities determining the given conductivity type of that material, so that a zone in the semiconductor body immediately adjacent to the base contact has a higher impurity concentration by additional impurity substance entered from the contact and hence has a higher conductivity in the sense of the given type than the rest of base region.

As a result, the current carriers injected by the emitter are kept away from the base contact to a larger extent and are forced to travel to the collector, this being tantamount to increased current amplification. Besides, the effective resistance of the base electrode is reduced in the desired manner, also by virtue of the higher impurity concentration referred to of the zone adjacent to the base contact. This is due to the fact that the majority carriers of the base which are required for neutralizing the minority carriers injected from the emitter are now available in a larger quantity. Both above-mentioned effects are obtained to a higher degree the more closely the highly doped region immediately ahead of the base contact extends toward the highly doped emitter and collector regions, that is toward the p-n junctions delimiting those regions from the base region of the semiconductor body.

For the purpose of reducing the mutual spacing of all parts of a transistor, it is known to locate the emitter and collector regions on mutually opposed flat sides of the semiconductor body, and to place the base contact onto one of the narrow sides of the body. In such a design, the emitter or collector respectively has been placed into a depression, and the base contact has been mounted on a part of the raised area surrounding the depression. In such transistors, however, the current paths between the emitter or collector electrode on the one hand and the base on the other hand become, at least in part, undesirably long. In another known transistor the base contact is mounted on one of the two broad sides of the body, while the emitter and the collector are placed on the opposite side and are subdivided into alternately sequential parts. With such a design, the individual parts of the emitter and collector are close to each other at their neighboring edge portions, as is required for proper functioning of these electrodes, but the points located closer to the center of the individual parts can hardly become active because the current paths between them are a multiple of the spacing between the edges.

Relating, generally, to transistors of the above-mentioned type having the emitter and collector located on mutually opposite broad sides of the semiconductor, it is another object of the invention to improve the special conditions so as to afford increased efficacy of a transistor of given overall dimensions.

To achieve this improvement, and in accordance with another feature of my invention, at least one of the two electrodes serving as emitter or collector is subdivided into parts which cover respective mutually spaced area portions of the semiconductor body, and the base contact is likewise subdivided into parts mounted in the interstices between the area portions covered by the subdivided emitter or collector respectively. According to another, more specific feature, the area portions covered by the said subdivided electrode are sunken into the semiconductor body, and the several parts of the base contact are located on the raised area portions. In contrast to the known transistors having a likewise sunken but not subdivided emitter or collector, the just-mentioned design according to the invention eliminates the occurrence of undesirably long current paths.

The foregoing and more specific objects and features of the invention will be apparent from the following description of the embodiments exemplified by the drawing in which Fig. 1 is a longitudinal section of a triode junction transistor according to the invention, Fig. 2 is a top view, Fig. 3 a side view in the direction of the arrow L shown in Fig. 1, and Fig. 4 another side view in the direction of the arrow R.

The illustrated transistor comprises a semiconductor body H, for instance of germanium. However, the body may also consist of silicon, or a semiconducting compound, preferably a binary compound of respective elements from the third and fifth group of the periodic system such as indium antimonide or indium arsenide. The body H may have p-conductivity or n-conductivity, it being assumed in the example here described that the substance is n-conductive. One of the two electrodes, serving as emitter or collector here represented by the emitter E, is mounted on the lower broad side of the semiconductor body H. The emitter contact E consists of aluminum, indium or any other suitable acceptor material, that is, the contact metal is an element from the third group of the periodic system or an alloy of such an element. The contact E is joined with the germanium body H by fusing.

Consequently, the aluminum or indium coating forms an alloy with the immediately adjacent zone of the germanium body H. After resolidification of the fused alloy a p-conducting zone of germanium is formed adjacent to the emitter contact E, this zone constituting the emitter region end being schematically represented at p. A current lead F is soldered or otherwise joined with the emitter contact E for connection into an electric circuit.

The broad side of the semiconductor H opposite to the emitter E is at first provided with recesses. These recesses are produced by mechanical means, for instance sawing or drilling, or also by chemical means, namely by etching. They are preferably applied so as to form a regular pattern. In the illustrated embodiment, the recesses have the form of parallel grooves K which are connected with each other by individual transverse grooves. The transverse grooves in the illustrated embodiment are located along the outer margins of the body.

The recesses K have their bottoms contacted by acceptor material, for instance aluminum or indium which is joined and alloyed with the semiconductor body in the above described manner. The entire layer of contact metal then has an integral or unitary design of a coherent pattern and, in the present example, forms the collector electrode C which is likewise provided with a current lead D. When the collector contact is fused and alloyed with the semiconductor body, a p-conducting zone is formed in the germanium body immediately adjacent to the collector contact, this zone constituting the collector region and being schematically shown and also denoted by p.

The raised areas which remain between the grooves K are contacted by nonor metal, that is an element from the fifth group of the periodic system, such as antimony or an alloy of antimony; and this material forms the base contact B. The base contact is applied also by a fusing process forming an alloy. Consequently, a zone having an increased concentration of donor substance is formed in the semi-conductor body immediately adjacent to each part of the base contact, this increased donor region being not represented on the drawing. The individual strip-shaped parts of the base contact are connected with each other by a separate metal strip S of the same or any other suitable metal, a current supply lead A being attached to the strip S.

The recesses for the subdivided one of the electrodes serving as emitter or—in the present case—as collector may also be given such a design that the raised areas remaining between recesses are contiguous and form together a coherent pattern. This is the case, for instance, if in the illustrated embodiment one of the two transverse grooves is omitted, so that a raised bridging portion will remain. The recesses and the intermediate raised portions then form two patterns straddling each other in the manner of two combs. A corresponding arrangement of the electrodes can be produced analogously on a p-conducting semiconductor body. For instance, for a semiconductor body of a p-conducting germanium, antimony is suitable among others as the donor substance to form the contact metal for the emitter and collector respectively, while the base is to be contacted by acceptor material such as aluminium or indium.

Reverting to the above described p-n-p junction transistor as shown on the drawing, a complete example for the manufacture of the device will now be described in detail.

The semiconductor body H is formed of a piece of 25 mm. length, 15 mm. width and 0.5 mm. thickness. This piece is cut by means of a diamond saw from a suitable location of an n-conducting monocrystal of germanium or silicon. The monocrystal is produced either in the known manner by pulling it out of a melt, by the known zone melting method, or it may be produced without application of a crucible by the improved zone-melting method described in my copending application Serial No. 409,610, filed February 11, 1954 for Processing of Semiconductor Devices, assigned to the assignee of the present invention. The zone-melting methods permit the obtaining of a crystal of particularly high purity and quality, and also permit the doping of the semiconductor material to the desired degree and to the desired type of conductivity. The doping is conducted so that the resistivity of the semiconductor is approximately in the order of magnitude of 10 ohm·cm. for germanium or 100 ohm·cm. for silicon. One of the broad sides of the prismatic and flat body is then machined, likewise by a diamond saw, to produce parallel grooves of about 0.25 mm. depth, 2 mm. width, and 2 mm. mutual spacing. The transverse grooves are produced in the same manner and are given the same depth of 0.25 mm. and the same width of 2 mm. Then the entire exterior surface of the semiconductor body is smoothened by etching. Applicable is, for instance, the mixed etching liquid known under the trade name CP 4 and consisting of hydrofluoric acid, nitric acid, acetic acid and an addition of bromine.

For generating and contacting the emitter and collector regions, the planar broad side of the body is first coated over the entire area by vaporizing aluminum onto the surface up to a coating thickness of about 0.05 mm. Thereafter the bottoms of the grooves on the other side of the body are likewise coated with a layer of the same thickness by vaporization of aluminum, the raised areas being covered during vaporization by a protective stencil or shield of a suitable metal, such as steel or molybdenum. After removing the stencil, strips of metal foil, rolled down to a thickness of 0.05 mm. and cut to size, are placed upon the raised areas. These strips consist of an alloy of gold with up to 10% antimony. The strips are fastened to the semiconductor body by placing the body with the foils between two plates of graphite and holding the assembly together by a molybdenum clamp. The semiconductor thus prepared is placed into an electric furnace together with the clamping device. The furnace is filled with protective atmosphere, for instance argon, and is slowly heated. That is, for germanium transistors the heating is controlled to increase about 60° per minute up to a maximum of about 670° C. Then the temperature is kept for two minutes at 670° C. Thereafter, the temperature is cooled at a rate of about 10° C. per minute. Silicon is heated at the same rate of 60° per minute up to a limit of about 900° and is then kept four minutes at this limit before being cooled down at the same slow rate of 10° per minute.

After terminating the heating process, the thickness of the fundamental semiconductor body that remained unchanged between the now p-conducting emitter and collector regions is about 0.05 mm. This intermediate, still n-conducting portion is bordered by the p-n-junctions which delimit it from the emitter and collector regions respectively. The n-conducting regions of a higher impurity concentration immediately adjacent to the individual parts of the base contact, extend approximately 0.1 mm. deep into the semiconductor body.

The current supply leads D and F are preferably made of strips of silver foil 0.1 mm. thick. One end of these strips is soldered to the aluminum contacts in the conventional manner. A similar strip, 10 mm. wide, is joined by soldering with the individual gold contacts of the various base contact portions, also in the conventional manner. Ordinary copper leads can be connected to the free ends of the silver strips, for instance by soldering, clamping, terminal screws or any other desired manner.

I claim:

1. A junction transistor, comprising a semiconductor body of a given conductivity type having two opposite broad sides, two electrodes serving as emitter and collector respectively, both having conductivity of a type opposite to the said given type, one of said electrodes extending on one of said broad sides, said other electrode comprising mutually spaced recessed connected parts and being located on the opposite broad side, the recession being less than the thickness of the body, and a base contact comprising respective parts fused onto said opposite broad side only on raised portions between said spaced parts of said other electrode and out of contact therewith, said base contact comprising doping material adapted to increase the conductivity of said given type of said body and forming within said body close to the respective parts of the base contact a zone of higher conductivity in the sense of the given type than the rest of the base region.

2. A junction transistor, comprising a flat semiconductor body of a given conductivity type having two opposite broad sides, two electrodes serving as emitter and collector respectively and both having conductivity of a type opposite the said given type, one of said electrodes extending on one of said broad sides, said other broad side having a number of recessed areas and intermediate raised areas, the recession being less than the thickness of the body, said other electrode comprising mutually spaced parts retained within said respective recessed areas, and a base contact comprising respective parts fused on said raised areas and consisting of material having on said body a doping effect in the sense of said given type of conductivity.

3. A junction transistor, comprising a semiconductor body of a given conductivity type having two opposite broad sides, two electrodes serving as emitter and collector respectively, both having conductivity of a type opposite the said given type, one of said electrodes extending on one of said broad sides, said other broad side having a number of recessed areas and intermediate raised areas, said recessed areas being recessed less than the thickness of the body and forming together an integral connected pattern, said other electrode comprising mutually spaced parts in said recessed areas and forming an integral connected contact layer corresponding to said pattern, and a base contact comprising respective parts fused onto said raised areas and consisting of material having on said body a doping effect in the sense of said given type of conductivity.

4. A junction transistor, comprising a semiconductor body of a given conductivity type having two opposite broad sides, two electrodes serving as emitter and collector respectively, both having conductivity of a type opposite the said given type, one of said electrodes extending on one of said broad sides, said other broad side having a number of recessed areas and intermediate thereto raised areas, said raised and recessed areas each being independently connected to form integral raised and integral recessed patterns, said other electrode comprising mutually spaced parts in said recessed areas, and a base contact comprising respective parts fused onto said raised areas and consisting of material having on said body a doping effect in the sense of said given type of conductivity, said parts of said base contact being connected and forming together a single member shaped in accordance with said raised pattern.

5. A junction transistor, comprising a flat semiconductor body of a given conductivity type having two opposite broad sides, two electrodes serving as emitter and collector respectively both having conductivity of a type opposite the said given type, a first one of said electrodes extending on one of said broad sides, said other broad side having a number of transverse grooves and a depression interconnecting the transverse grooves, and having intermediate raised areas, the other electrode comprising mutually spaced parts located in said transverse grooves and an interconnecting part located in the interconnecting depression, and a base contact comprising respective parts fused onto said raised areas and consisting of material having on said body a doping effect in the sense of said given type of conductivity, the grooves and the depression having a depth less than the thickness of the body.

6. In a junction transistor according to claim 3, said pattern of said other electrode being comb shaped, and said parts of said base contact forming together another comb shape and being disposed in straddling relation to said comb-shaped electrode.

7. A junction transistor, comprising a flat semi-conductor body of a given conductivity type having two opposite broad sides, two electrodes serving as emitter and collector respectively and both having conductivity of a type opposite the said given type, one of said electrodes extending on one of said broad sides, said other broad side having a number of areas recessed less than the thickness of the body and intermediate thereto raised areas, said other electrode comprising mutually spaced parts retained within said respective recessed areas, and a base contact comprising respective parts mounted on said raised areas out of contact with said spaced parts.

8. The method of producing a junction transistor which comprises preparing a wide area body from semiconducting substance of a given conductivity type, machining a continuous interconnected pattern of non-perforate recesses into one of the broad sides of the body, coating the other broad side and the bottom of said recesses with contact material, capable of changing conductivity type in said body to the opposite type, providing said one broad side on its raised areas between said recesses, and out of contact with the contact material therein, with base contact material capable of increasing said given type of conductance in said body, and heating the assembly to fuse the coatings and said material and to alloy it with the adjacent parts of said body.

9. The method of producing a junction transistor which comprises preparing a wide area body of flat shape from semiconducting substance of a given conductivity type, chemically etching one broad side of said body in form of a pattern to produce a group of non-perforate recesses, coating the other broad side and the bottom of said recesses with contact material, capable of changing conductivity type in said body to the opposite type, providing said one broad side on its raised areas between said recesses with base contact material capable of increasing said given type of conductivity in said body, and heating the assembly to fuse the coatings and said material and to alloy it with the adjacent parts of said body.

10. The method of producing a junction transistor which comprises preparing a body of flat and enlarged shape from semiconducting substance of a given conductivity type, forming a group of interconnected non-perforate recesses in one of the broad sides of the body, covering the remaining raised areas of said one broad side with a stencil, vaporizing a coating of material capable of changing conductivity type onto said two broad sides and removing the stencil, so that only the recesses remain coated with said material on said one broad side, providing said one broad side on its raised areas between said recesses with coating material, heating the assembly to fuse the coatings and to alloy it with the adjacent parts of said body.

11. A junction transistor, comprising a flat semiconductor body of a given conductivity type having two opposite broad sides, two electrodes serving as emitter and collector respectively both having conductivity of a type opposite the said given type, a first one of said electrodes extending on one of said broad sides, said other broad side having a number of transverse grooves and a depression inetrconnecting the transverse grooves, and having the other electrode comprising mutually spaced parts located in said transverse grooves and an interconnecting part located in the interconnecting depression, and a base contact comprising respective parts fused onto said raised areas and consisting of material having on said body a doping effect in the sense of said given type of conductivity, the grooves and the depression having a depth less than the thickness of the body, the base contact and said other electrode being so restricted in area of contact with the said grooves and raised areas of the semiconductor body that the base contact and the said other electrode are not contiguous with each other on the semiconductor body.

12. A junction transistor, comprising a flat semi-conductor body of a given conductivity type having two opposite broad sides, two electrodes serving as emitter and collector respectively and both having conductivity of a type opposite the said given type, one of said electrodes extending on one of said broad sides, said other broad side having a number of recessed areas and intermediate raised areas, the recession being less than the thickness of the body, said other electrode comprising mutually spaced parts retained within said respective recessed areas, and a base contact comprising respective parts fused on said raised areas and consisting of material having on said body a doping effect in the sense of said given type of conductivity, the said recessed areas being parallel and equidistantly spaced from each other, and being interconnected by a depressed area on the bottom of which another part of said other electrode is carried, the said parts of the latter being integral.

13. A junction transistor, comprising a flat semiconductor body of a given conductivity type having two opposite broad sides, two electrodes serving as emitter and collector respectively both having conductivity of a type opposite the said given type, a first one of said electrodes extending on one of said broad sides, said other broad side having a number of transverse grooves and a depression interconnecting the transverse grooves, and having intermediate raised areas, the other electrode comprising mutually spaced parts located in said transverse grooves and an interconnecting part located in the interconnecting depression, and a base contact comprising respective parts fused onto said raised areas and consisting of material having on said body a doping effect in the sense of said given type of conductivity, the grooves and the depression having a depth less than the thickness of the body, the said transverse grooves being parallel and equidistantly spaced from each other, the interconnecting depression connecting the adjacent ends of the transverse grooves.

14. The apparatus defined in claim 5, the semiconductor body being taken from the group consisting of germanium, silicon, and semiconductor binary compounds of elements taken from the group consisting of the third and fourth groups of the periodic system, the emitter and collector electrodes being composed of an alloying acceptor material.

15. The method defined in claim 8, the semiconductor body being taken from the group consisting of germanium, silicon, and semiconductor binary compounds of elements taken from the group consisting of the third and fourth groups of the periodic system.

16. A junction transistor, comprising a flat semiconductor body of a given conductivity type having two opposite broad sides, two electrodes serving as emitter and collector respectively, both having conductivity of a type opposite the said given type, one of said electrodes extending on one of said broad sides, said other electrode comprising mutually spaced parts on the opposite broad side, said parts being interconnected and forming together a regular pattern, and a base contact comprising respective parts connected only to and fused only onto said opposite broad side on raised parts of the latter situated between said spaced parts of said other electrode, said base contact comprising doping material adapted to increase the conductivity of said given type of said body.

References Cited in the file of this patent

UNITED STATES PATENTS

| | | |
|---|---|---|
| 2,597,028 | Pfann | May 20, 1952 |
| 2,603,693 | Kircher | July 15, 1952 |
| 2,705,767 | Hall | Apr. 5, 1955 |
| 2,764,642 | Shockley | Sept. 25, 1956 |
| 2,792,539 | Lehovec | May 14, 1957 |

FOREIGN PATENTS

| | | |
|---|---|---|
| 1,080,034 | France | May 26, 1954 |
| 527,382 | Belgium | Sept. 17, 1954 |